United States Patent
Elliot

(10) Patent No.: US 6,785,524 B2
(45) Date of Patent: Aug. 31, 2004

(54) DEVICE AND METHOD FOR CONTROLLING THE AMPLITUDE OF SIGNALS

(75) Inventor: Sebastian Elliot, Alton (GB)

(73) Assignee: Nokia Corporation, Espoo (FI)

( * ) Notice: Subject to any disclaimer, the term of this patent is extended or adjusted under 35 U.S.C. 154(b) by 335 days.

(21) Appl. No.: 09/881,395

(22) Filed: Jun. 14, 2001

(65) Prior Publication Data

US 2002/0022493 A1 Feb. 21, 2002

Related U.S. Application Data

(63) Continuation of application No. PCT/GB99/04255, filed on Dec. 16, 1999.

(30) Foreign Application Priority Data

Dec. 18, 1998 (GB) .............................. 9828041

(51) Int. Cl.[7] .............................. H04B 1/06; H04B 7/00
(52) U.S. Cl. .............................. 455/232.1; 455/249.1; 455/253.2
(58) Field of Search .............................. 455/138, 136, 455/232.1, 234.1, 234.2, 241.1, 249.1, 253.2, 561, 250.1, 254, 506, 101, 133–135, 137; 327/355, 361, 356, 352, 363

(56) References Cited

U.S. PATENT DOCUMENTS

| | | | |
|---|---|---|---|
| 4,208,632 A | | 6/1980 | Sheldon et al. |
| 4,270,223 A | | 5/1981 | Marston |
| 4,330,859 A | | 5/1982 | Takada |
| 5,276,685 A | * | 1/1994 | Kepler et al. ................ 370/332 |
| 5,305,468 A | * | 4/1994 | Bruckert et al. .............. 455/69 |
| 5,604,460 A | | 2/1997 | Sehrig et al. |
| 5,805,581 A | * | 9/1998 | Uchida et al. .............. 370/335 |
| 6,035,001 A | * | 3/2000 | Eklund et al. .............. 375/316 |

FOREIGN PATENT DOCUMENTS

EP 0859462 A1 8/1998

OTHER PUBLICATIONS

International Search Report for PCT/GB99/04255.

* cited by examiner

Primary Examiner—Marsha D. Banks-Harold
Assistant Examiner—James Moore
(74) Attorney, Agent, or Firm—Squire, Sanders & Dempsey L.L.P.

(57) ABSTRACT

A device for ensuring that the amplitude of signals fall within a predetermined range, said device comprising input means for receiving a plurality of input signals at substantially the same time, a first path for increasing the amplitude of any of the input signals having an amplitude below a first threshold, a second path for decreasing the amplitude of any of the input signals having an amplitude which exceeds a second threshold and combining the outputs of the first and second paths to provide a plurality of signals having amplitudes between said first and second thresholds.

19 Claims, 5 Drawing Sheets

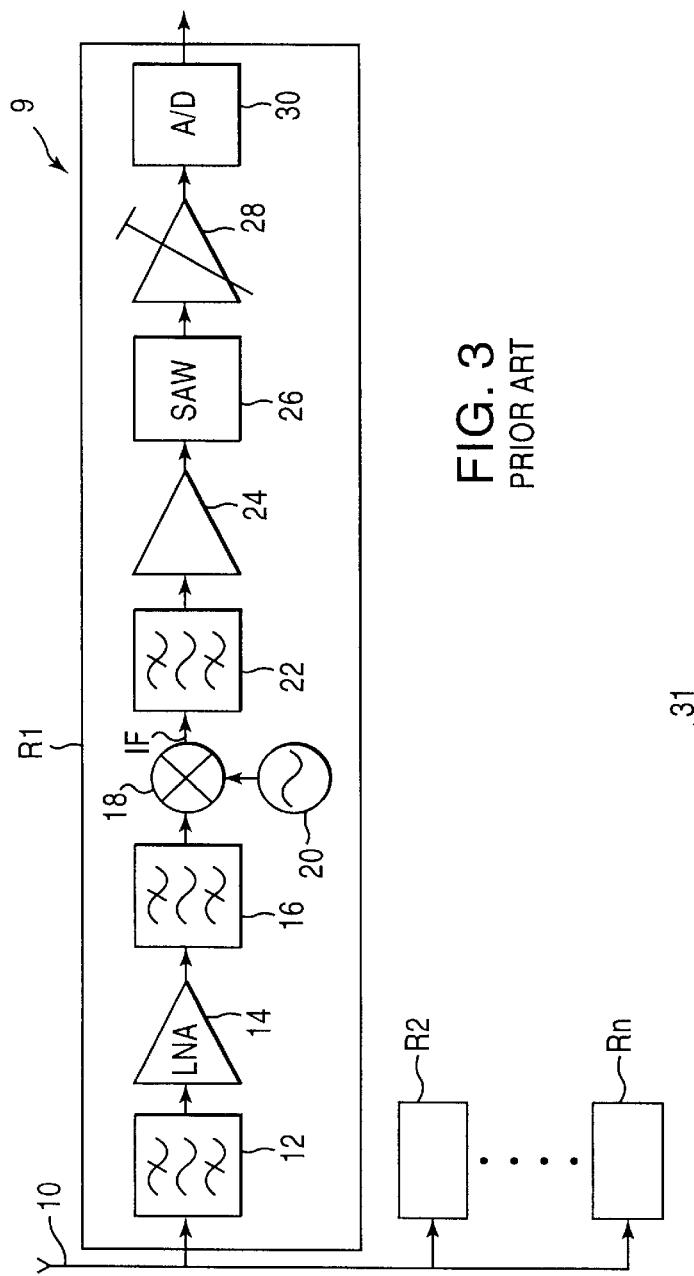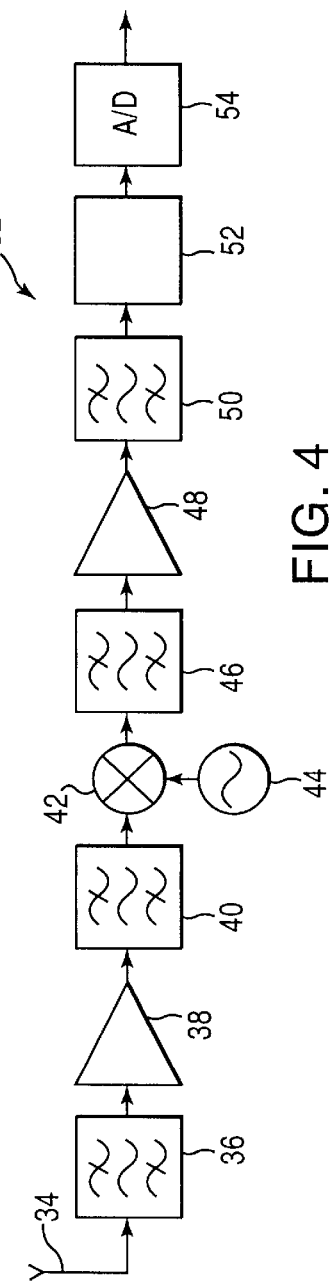
FIG. 3
PRIOR ART
FIG. 4

(FIGURES NOT DRAWN TO SCALE)

DEVICE AND METHOD FOR CONTROLLING THE AMPLITUDE OF SIGNALS

This application is a continuation of international application Serial No. PCT/GB99/04255, filed Dec. 16, 1999.

FIELD OF THE INVENTION

The present invention relates to a device and method for ensuring that the amplitude of signals fall within a predetermined range.

In particular, but not exclusively, the device and method can be used in a receiver for a wireless telecommunication network.

BACKGROUND TO THE INVENTION

FIG. 1 illustrates a known wireless telecommunication network 2. The area covered by the network 2 is divided into a number of cells 4. Each cell 4 has associated therewith a base transceiver station 6. Each base transceiver station 6 is arranged to communicate with the terminals 8 located in the cell 4 associated with that base transceiver station 6. The terminals 8 may be mobile stations which are able to move between the cells 4.

Each base transceiver station is, in the GSM standard (Global System for Mobile Communications), arranged to receive N channels out of M available channels C1 ... CM, as illustrated in FIG. 2a. The M channels C1 ... CM occupy a bandwidth of XMHz. Each channel therefore has a width of X/M MHz. Typically this will be around 200 KHz. Each channel is divided into frames F one of which is shown in FIG. 2b. Each frame is divided into eight slots S1 ... S8. The GSM standard is a time division multiple access (TDMA) system and accordingly different mobile stations will be allocated different slots. Thus, the base transceiver station will receive signals from different mobile stations in different time slots in the same channel. N is usually much less than M.

There are two forms of GSM, E_GSM and GSM1800. E_GSM operates in the frequency band of 880–915 MHz for the receipt of signals by the base station. GSM 1800 operates in the frequency band of 1710 to 1785 MHz for the receipt of signals by the base station. E_GSM 900 and GSM_1800 operate with bandwidths of 35 MHz and 75 MHz respectively. For E_GSM M=125 and for GSM 1800 M=375.

Reference is made to FIG. 3 which shows part of a known base transceiver station 9 which is arranged to receive N channels at the same time. For clarity, only the receiving part of the base transceiver station 9 is shown. The base transceiver station 9 has an antenna 10 which is arranged to receive signals from mobile stations in the cell served by the base transceiver station 9. The base transceiver station comprises N receivers R1, R2 ... RN. Thus one receiver is provided for each channel which is to be received by the base station 9. All of the receivers R1–RN are the same and accordingly the components of the first receiver R1 only are shown.

The first receiver R1 comprises a first bandpass filter 12 which is arranged to filter out signals which fall outside the bandwidth in which the M available channels are located. The filtered output is input to a first low noise amplifier 14 which amplifies the received signals. The amplified signal is then passed through a second bandpass filter 16 which attenuates spurious frequencies, noise, and harmonics or the like introduced by the first amplifier 14. The output of the second bandpass filter is connected to a mixer 18 which receives a second input from a local oscillator 20. The frequency of the output of the local oscillator 20 will depend on the frequency of the channel allocated to the particular receiver. The output of the second bandpass filter 16 is mixed with the output of the local oscillator 20 to provide a signal at an intermediate frequency IF, which is less than the radio frequency at which the signals are received. The intermediate frequency IF output by the mixer 18 of each receiver will be the same for all receivers.

The output of the mixer 18 is input to a third bandpass filter 22 which filters out spurious signals and the like generated by the mixer 18. The output of the third bandpass filter 22 is amplified by a second amplifier 24 and output to a surface acoustic wave (SAW) filter 26. The surface acoustic wave filter 26 filters the adjacent signals and interfering signals within the bandwidth X except that of the channel allocated to that particular receiver. In other words, all the channels received by the antenna 10 with the exception of the channel allocated to the receiver will be filtered by a combination of the first to third bandpass filters and the surface acoustic wave filter 26. The output of the surface acoustic wave filter 26 is connected to an automatic gain control unit 28 which alters the gain of the signal so that it falls within the dynamic range of an analogue to digital converter 30.

If the amplitude of the signal input to the analogue to digital converter 30 is too high, then the converter 30 will become saturated, giving rise to phase errors, recovery time problems and unwanted noise. By the same token, if the signal input to the analogue to digital converter 30 is too low, then the received signal may be below the noise floor of the converter 30. In other words, if the signal is too small, it will be swamped by the noise floor and information carried by the signal may be lost.

One problem with the known architecture is that it is necessary to provide a receiver for each channel. This is to ensure that each signal which is input to an analogue to digital converter is within the dynamic range of that converter. The need to provide a receiver for each channel increases substantially the costs of the base transceiver station. It is therefore an aim of embodiments of the present invention to solve or at least mitigate this problem.

Another problem with the known receiver is that it is necessary to use a SAW filter to filter out the adjacent channels and high power interferers which compromise the dynamic range of the converter 30. SAW filters are expensive. It is therefore also an aim of embodiments of the present invention to provide a device for ensuring that signals fall within the dynamic range of, for example, an analogue to digital converter. It is preferred that this device not require the use of SAW filters.

SUMMARY OF THE INVENTION

According to one aspect of the present invention, there is provided a device for ensuring that the amplitude of signals fall within a predetermined range, said device comprising input means for receiving a plurality of input signals at substantially the same time; a first path for increasing the amplitude of any of the input signals having an amplitude below a first threshold; a second path for decreasing the amplitude of any of the input signals having an amplitude which exceeds a second threshold; and combining the outputs of the first and second paths to provide the plurality of signals having amplitudes between said first and second thresholds.

Thus, it can be ensured that signals which are too large are reduced to a lower amplitude whilst signals which are too small are increased to a larger amplitude. In this way, the device is able to ensure that the amplitude of signals fall within a predetermined range.

The first and second thresholds may be the same or different.

Preferably, the second path comprises attenuator means. Preferably, signals which have an amplitude below the second threshold are removed by the second path. Those signals may be removed by reducing those signals to substantially zero. This can, for example, be achieved by the attenuator means and is both simple and cost effective.

Preferably, the first path comprises amplifier means.

Removing means may be provided to remove signals from said first path having an amplitude exceeding said first threshold. An output of the second path may be introduced in the first path and the output of the second path may be used by said removing means to cancel out the signals in the first path having an amplitude exceeding the first threshold. A phase shift may be provided so that one of the signals output by the second path introduced into the first path and signals on the first path is 180° out of phase with respect to the other of the signals output by the second path introduced into the first path and the signals of the first path. Preferably, the removing means comprises a summer for summing the input to the first path with the output from the second path to cancel signals which have an amplitude which is greater than the first threshold. This is particularly advantageous when the second path provides signals which initially exceed the second threshold and the first path provides signals which initially have an amplitude below the first threshold.

The input means may be connected to splitter means which provide a plurality of sets of signals, each set comprising a plurality of input signals. One set may be input to the first path, the other set may be input to the second path. Preferably, the first amplitude of the sets of signals are the same.

Preferably, the device has output means connected to the output of the first and second paths for outputting said signals to an analogue to digital converter. A device as described hereinbefore may be provided in combination with an analogue to digital converter. A receiver may incorporate a device as described hereinbefore. That receiver may be incorporated in a base transceiver station.

According to a second aspect of the present invention, there is provided a method for ensuring that the amplitude of signals fall within a predetermined range, said method comprising the steps of receiving a plurality of input signals at substantially the same time; increasing the amplitude of signals having an amplitude below a first threshold; decreasing the amplitude of signals having an amplitude which exceeds a second threshold; and combining the said signals thus providing a plurality of signals having amplitudes between said first and second thresholds.

BRIEF DESCRIPTION OF THE DRAWINGS

For a better understanding of the present invention and as to how the same may be carried into effect, reference will now be made by way of example to the accompanying drawings in which:

FIG. 3 shows a schematic view of the receiving part of a base transceiver station;

FIG. 4 shows a receiver embodying the present invention;

DETAILED DESCRIPTION OF PREFERRED EMBODIMENTS OF THE INVENTION

Figure 1:
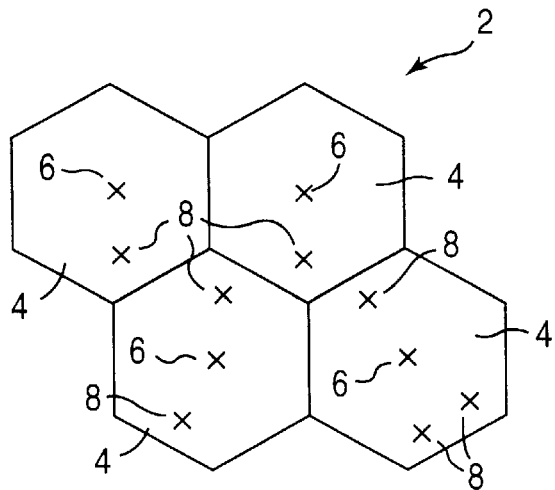
FIG. 1 shows a typical wireless cellular telecommunications network.
Figure 2A:
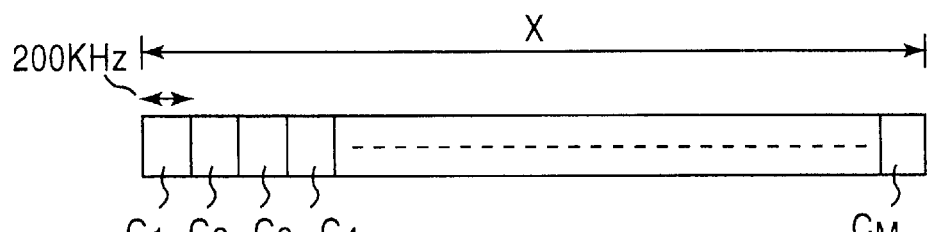
FIG. 2a shows an example of the channels receivable by base transceiver stations in a GSM system.
Figure 2B:
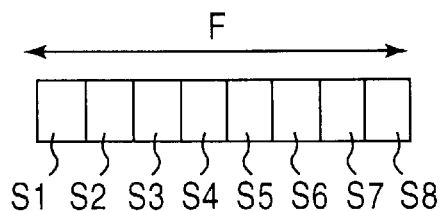
FIG. 2b shows the structure of a frame, used on each channel.

Reference will now be made to FIG. 4 which illustrates the receiver part 32 of a base transceiver station 31 embodying the present invention. Unlike the known base transceiver station, illustrated in FIG. 3, the base transceiver station 31 embodying the present invention only has a single receiver 32 which deals with all N channels to be received by the base transceiver station at the same time.

The receiving part 32 of the base transceiver station 31 comprises an antenna 34 which receives signals from the mobile stations in the cell associated with the base transceiver station. For the purposes of illustration, it will be assumed that the antenna 34 receives four channels CH1, CH2, CH3 and CH4 on frequencies F1, F2, F3 and F4 respectively. These channels are typically separated by at least 600 KHz. It should be appreciated that the base transceiver station 31 can of course receive more or less than 4 channels at the same time. For convenience, the embodiment of the present invention will be described in the context of a GSM system. However, it should be appreciated that embodiments of the present invention are applicable to any other suitable standard.

The signals which are received by the antenna 34 including the four channels CH1–4 are input to a first bandpass filter 36. The first bandpass filter 36 filters out any signals which fall outside the bandwidth in which the N channels are located. The filtered output is input to a first amplifier 38 which amplifies the signals. The amplified signals are input to a second bandpass filter 40 which removes any noise introduced by the first amplifier 38.

The output of the second bandpass filter 40 is input to a mixer 42 which also receives an input from a local oscillator 44. The frequency of the signal output by the local oscillator is such that when the output of the local oscillator 44 is mixed by the mixer 42 with the received signals from the second bandpass filter 40, the received signals are reduced to an intermediate frequency IF. The intermediate frequency is much less than the radio frequency of the received signals.

The output of the mixer 42 is input to a third bandpass filter 46 which filters out spurious mixer signals and other order signals without compromising the signal at the intermediate frequency. The output of the third bandpass filter is input to a second amplifier 48 which amplifies the signals. The output of the second amplifier 48 is input to a fourth bandpass filter 50 which removes any noise introduced by the second amplifier 48.

The output of the fourth bandpass filter 50 is input to a device 52 which is arranged to ensure that the amplitude of the signals in each of the four channels CH1–4 is within the dynamic range of an analogue to digital converter 54 connected to the output thereof. The device 52 for altering the amplitude of the signals to be within the dynamic range of the analogue to digital converter 54 will be described in more detail hereinafter. The signals output by the device 52 are input to the analogue to digital converter 54 where the analogue signals are converted to digital form. The output of the analogue to digital converter 54 is input to a digital down converter (not shown) which converts the signals to the baseband frequency and a digital signal processor (not shown) which processes the signals in order to obtain information carried by those signals.

Figure 5:
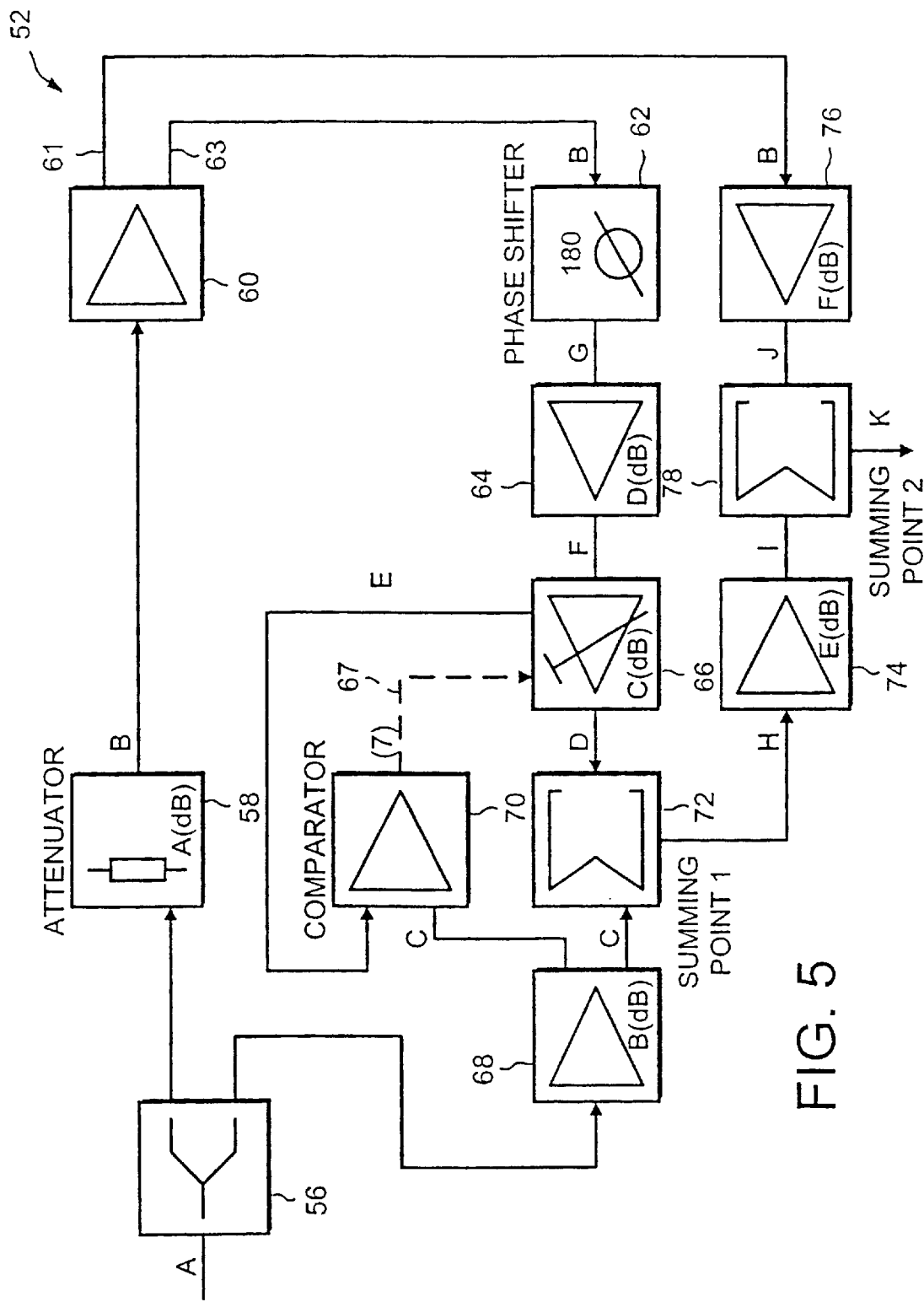
FIG. 5 shows in more detail, the device shown in FIG. 4 for ensuring that the signals are within the dynamic range of the analogue to digital converter.
Figure 6:
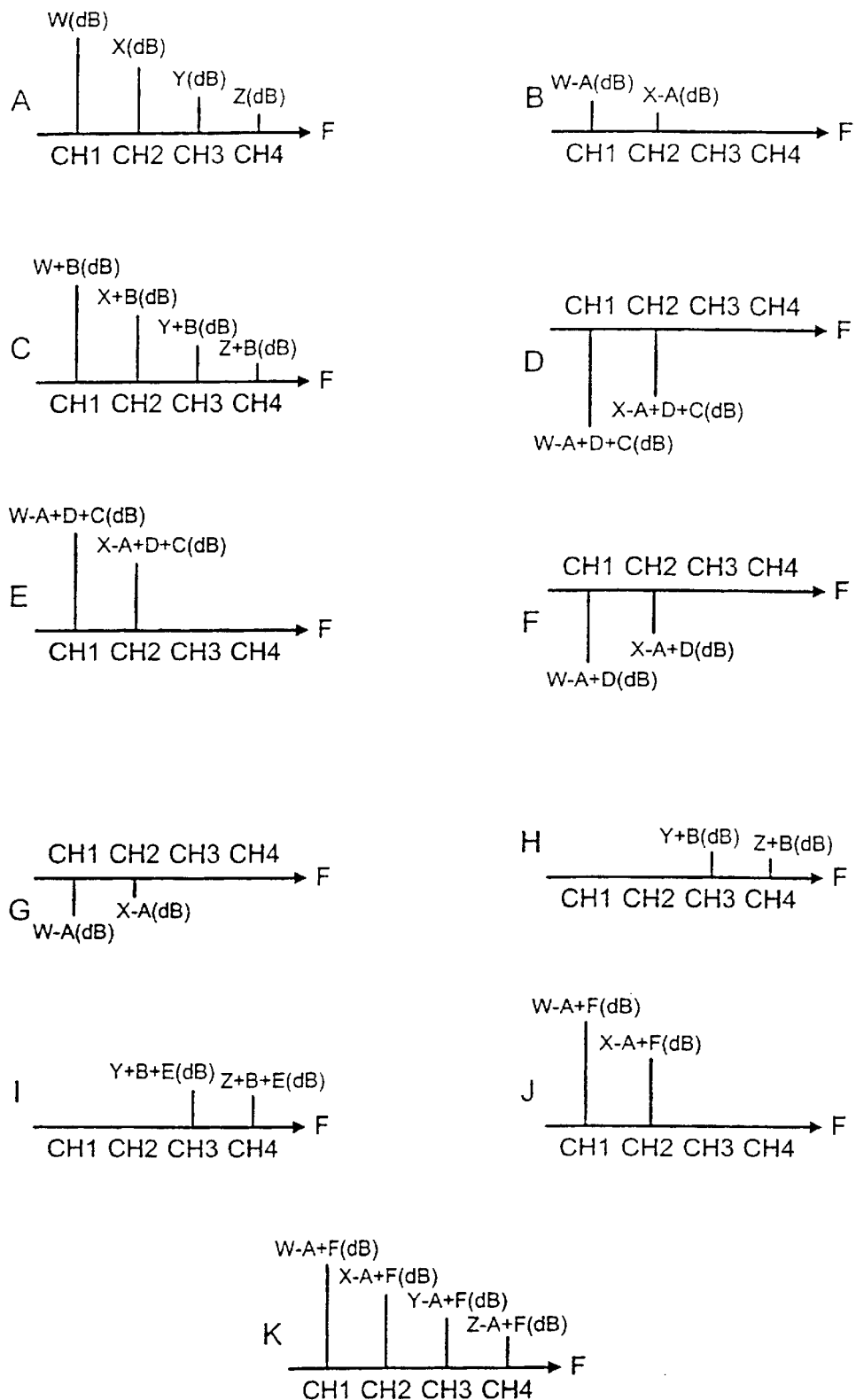
FIGS. 6a–k illustrate (not to scale) the amplitude of the signals at different points in the device of FIG. 5.

Reference will now be made to FIG. 5 which shows the device 52 in more detail and FIGS. 6*a–k* which shows the amplitude of the signals at various points in the device 52. It should be emphasised that the amplitude of the signals illustrated in FIG. 6 are not to scale and each Figure illustrates the relative size of signals at a given point.

The output of the fourth bandpass filter 50 is input to the device 52. The relative amplitudes of the signals input to the device 52 are illustrated in FIG. 6*a*. As can be seen, the signals from first and second channels CH1 and CH2, have amplitudes W and X and are likely to be from mobile stations which are relatively close to the base transceiver station 31. The amplitude of the signals on the third and fourth channels at CH3 and CH4 are Y and Z respectively and are much smaller than the amplitudes of the signals of channels CH1 and CH2. The signals on the third and fourth channels CH3 and CH4 are thus likely to be from mobile stations which are relatively far from the base transceiver station 31. For the purpose of this description, it should be appreciated that W, X, Y and Z are in dBm.

The signals input to the device 52 are input to a splitter 56 which splits equally the signals into two identical sets. Each set comprises four signals corresponding to the four channels CH1–4.

One set of signals output by the splitter 56 is input to an attenuator 58 which attenuates the received signals. The attenuation provided by the attenuator 58 is such that signals having an amplitude below a certain level are lost and signals having an amplitude above the threshold are attenuated. In particular, the level of attenuation is set such that smaller signals such as those on channels CH3 and CH4 are lost. FIG. 6*b* shows the output of the attenuator 58. As can be seen, the signal on channel CH1 has an amplitude of W−A where A is the attenuation provided by the attenuator. The signal on channel CH2 has an amplitude of X−A. The signals on channels CH3 and 4 have been attenuated to such a degree that they have been lost. Effectively Y−A and X−A are below the noise floor of the device 52.

The output of the attenuator 58 is connected to the input of a first amplifier block 60 which provides two outputs 61 and 63. Each of the outputs 61 and 63 is the same as that shown in FIG. 6*b*. In other words, the output of the attenuator 58 is amplified and then split so that the amplitude of the signals on outputs 61 and 63 are the same as that of the signals output by the attenuator 58. One output 63 of the first amplifier 60 is input to a phase shifter 62 which alters the phase of the signals input thereto by 180°. The output of the phase shifter 62 is illustrated in FIG. 6*g*. As can be seen the amplitude of the signals output by the phase shifter 62 are the same as the those input thereto but 180° out of phase.

The output of the phase shifter 62 is connected to a second amplifier 64 which amplifies the signals by D decibels. The output of the second amplifier 64 is shown in FIG. 6*f*. The amplitude of the signal on the first channel CH1 is now W−A+D. The amplitude of the signal on the second channel CH2 is now X−A+D. The output of the second amplifier 64 is connected to the input of a gain control block 66 which alters the amplitude of the signals by a factor of C decibels. The function of the gain control block 66 will be described in more detail hereinafter.

The second set of outputs from the splitter 56 is input to a third amplifier 68 which amplifies and splits the signals into two identical sets. Each set of signals output by the third amplifier is amplified by B decibels. Each set of signals output by the third amplifier 68 is shown in FIG. 6*c*. Thus the amplitude of the signal on the first channel CH1 output from the third amplifier 68 is W+B, X+B for the second channel CH2, Y+B for the third channel CH3 and Z+B for the fourth channel CH4.

One set of outputs from the third amplifier 68 is input to a comparator 70 along with a set of signals output from the gain control block 66. The output from the gain control block 66 is shown in FIG. 6*e* and is the same as the output of the second amplifier 64 but 180° out of phase with respect thereto and also amplified by a factor C. C represents the gain applied by the gain control block 66. The comparator 70 compares the two largest signals output by the third amplifier 68 with the two signals output by the gain control block 66 and provides an adjustment signal which is output to the variable gain control block 66 via line 67. This output represents the difference in amplitude between the signals on the first and second channels CH1 and CH2. The variable gain control block 66 alters the gain C applied to the signals input from the second amplifier 64 in order to ensure that the amplitude of the signals input from the third amplifier 68 to the comparator are the same as those output from the variable gain control block 66. In other words W−A+D+C=W+B and X−A+D+C=X+B.

The other set of outputs of the third amplifier 68 is input to a first summer 72 along with a second output from the variable gain control block 66. The second output of the gain control block input to the first summer 72 is represented by FIG. 6*d* whilst the input from the third amplifier 68 is, as discussed hereinbefore represented by FIG. 6*c*. The two set of signals output by the gain control block 66 and illustrated in FIGS. 6*d* and *e* are the same except the two sets are 180° are out of phase with respect to one another. The two sets of signals input to the first summer 72 are added together. As the signals on channels CH1 and CH2 in the two sets are equal in amplitude but 180° out of phase, these two signals will cancel out when added together. The output of the first summer 72 is thus shown in FIG. 6*h*. There will be a signal on the third channel CH3 and the fourth channel CH4 having the respective amplitudes Y+B and Z+B.

The output of the first summer 72 is input to a fourth amplifier 74 which amplifies the received signals by a factor of E. The output of the fourth amplifier 74 is shown in FIG. 6*i*. The signal on the third channel CH3 has an amplitude of Y+B+E and the signal on the fourth channel CH4 has an amplitude of Z+B+E.

The second output 61 from the first amplifier 60 is input to a fifth amplifier 76 which amplifies the signal by a factor F. The output of the fifth amplifier 76 is shown in FIG. 6*j*. The signal on the first channel CH1 has an amplitude W−A+F whilst the signal on the second channel has an amplitude of X−A+F. The output of the fourth and fifth amplifiers 74 and 76 are input to a second summer 78. As the output from the fourth amplifier 74 only includes the signals from the third and fourth channels CH3 and CH4 whilst the output of the fifth amplifier 76 only includes signals from the first and second channels CH1 and CH2. Thus, the output of the second summer 72 includes all four signals for all four channels CH1–4. The output of the second summer 72 is shown in FIG. 6k. The amplitude of the signal on the first channel CH1 is W−A+F, the amplitude of the signal on the second channel CH2 is X−A+F, Y+B+E on the third channel CH3 and Z+B+E on the fourth channel CH4.

Thus the difference in amplitude between the largest and the smallest signals will have been reduced. Effectively, the amplitude of the smallest signals will have been increased whilst the amplitude of the largest signals will have been decreased. In some embodiments of the present invention, the amplitude of the larger and the smaller signals may be the same or very similar. It should be appreciated that the amplitudes shown in FIG. 6 are only examples of possible values for the signals input to the device 52.

In the event that all four signals input to the device 52 are above the threshold of the attenuator 58, all four signals will be attenuated by the attenuator 58 and will be output to the second summer 78. In other words, no signals will be reduced to nothing by the attenuator 58. As four signals will be input to the first summer 72 from the variable gain control block 66 and from the third amplifier 68, there will be cancellation of all of the signals by the first summer 72 and there will be no input from the fourth amplifier 74 to the second summer 78. The four signals output by the second summer 78 will thus be those from the first amplifier 60.

Likewise, if all four signals are below the threshold of the attenuator 58, the signals will have been completely attenuated by the attenuator 58 and thus, there will be no output from the fifth amplifier 76 to the second summer 78. The first summer 72 will only receive the four signals from the third amplifier 68, there being no signals from the gain control block 66. Accordingly, all four signals will be output from the first summer 72 and input to the second summer 78 via the fourth amplifier 74. The signals received from the fourth amplifier 74 thus provide the output of the second summer 78.

Embodiments of the present invention also work where one signal is above or below the attenuator 58 threshold and three signals are respectively below or above the threshold.

Figure 7:
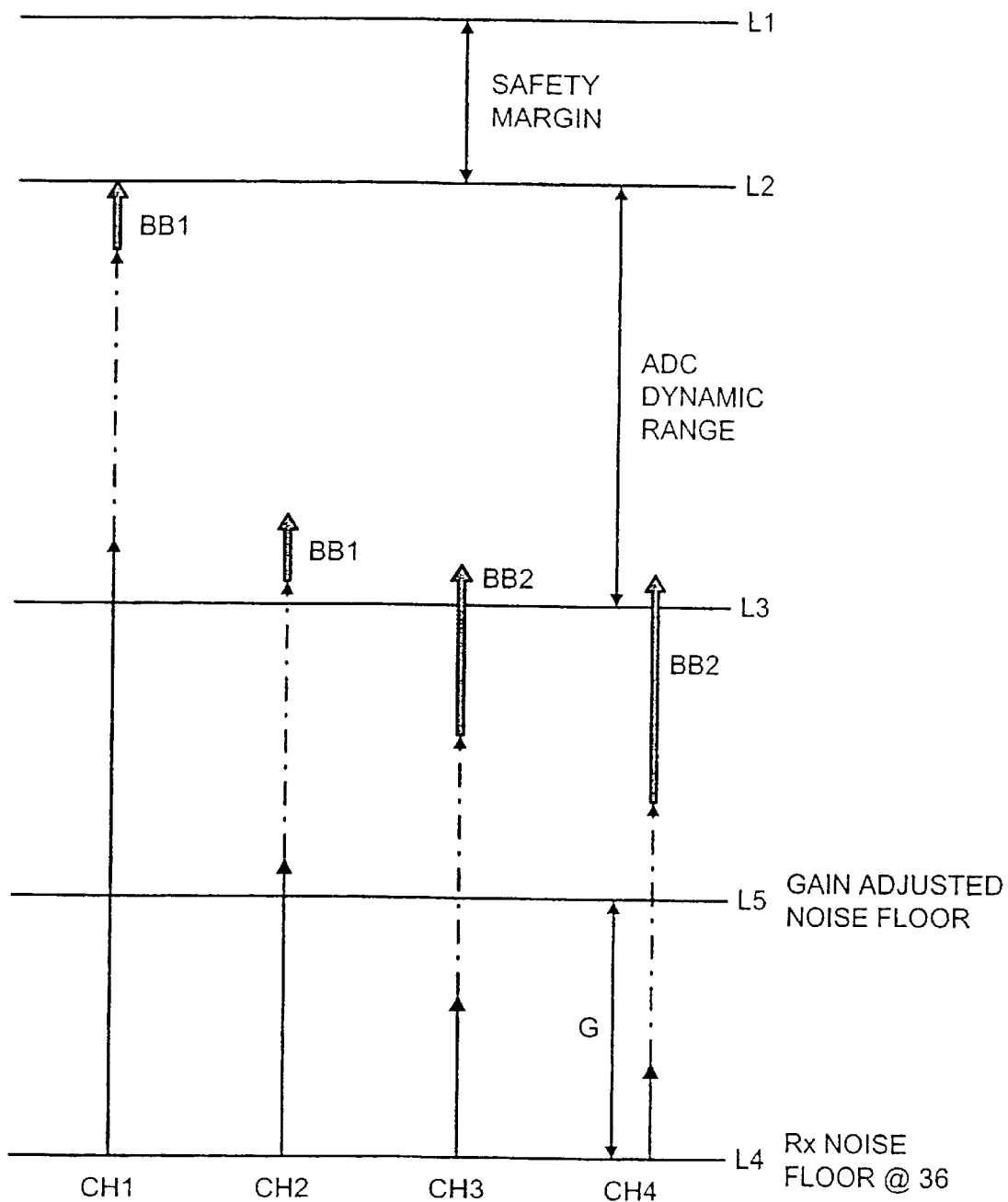
FIG. 7 shows a diagram illustrating the dynamic range of the analogue to digital converter of FIG. 4.

Reference will now be made to FIG. 7 which illustrates the principal behind embodiments of the present invention. Level 1 L1 represents the maximum amplitude of signals that can be received by the analogue to digital converter 54 which do not cause the converter 54 to go into saturation and thus produce unwanted noise components. Level 2 L2 represents the maximum amplitude of any signal which should be received by the analogue to digital converter. The difference between the first and second levels L1 and L2 represents a safety margin. Level 3 L3 is the noise floor of signals of the converter 54 and signals received by the converter 54 should not be below this level. If signals are below this noise floor, then the signals will be swamped by the background noise. The device 52 is arranged to amplify smaller signals so that they are above the level L3.

Level 4 L4 represents the receiver noise floor at the input to the receiver, that is at the input to the first RF filter 36 before the signal passes through the receiver chain shown in FIG. 4. Level 5 L5 represent the gain adjusted noise floor of the receiver for the signals which are input to the device 52. Level L5 is higher than level L4 as a result of the gain G introduced to the input signals by the first and second amplifiers 38 and 48. In FIG. 7, this gain applied to each of the four signals CH1–CH4 increases the signals to a level shown by the dotted lines. As can be seen from FIG. 7, the first and second signals on channels CH1 and CH2 are both above the analogue to digital converter noise floor L3.

However, even with the gain G, the signal on the third and fourth channels CH3 and CH4 are still below the noise floor L3.

The device shown in FIG. 5 then provides a further level of gain. As the signals of the first and second channels are, when input to the device 52, above the analogue to digital converter noise floor L3, a first gain of BB1 is applied and represents the consequence of the input signal following the path including the attenuator 58. BB2 is the gain applied to the signals on the third and fourth channels, which are at the input to the device 52 below the level of the analogue to digital noise floor L3. BB2 represents the gain resulting from the input signal following the path through amplifier 68. As can be seen from FIG. 7, all of the signals on all four channels are, when output from the device 52 within the dynamic range of the analogue to digital converter i.e. between levels L3 and L1. If the safety margin is considered, the effective dynamic range is between levels L3 and L2. All four signals shown in the figure are within this range.

Whilst embodiments of the present invention have been described in relation to a GSM system, embodiments of the present invention can be used with any other suitable standard including analogue standards, other standards using time division multiple access (TDMA), spread spectrum systems such as code division multiple access (CDMA), frequency division multiple access (FDMA), space division multiple access (SDMA) and hybrids of any of these systems.

Embodiments of the present invention have been described in the context of a receiver for a base transceiver station. However embodiments of the present invention can be used in any suitable receiver such as in a mobile station as well as in other types of receiver which are not used in cellular networks but which are arranged to receive a number of signals at the same time.

The device for altering the amplitude of signals is not limited in application to receivers and also need not also always be used in conjunction with a converter. The device can be used with any other element where the amplitude of the signals has to be controlled to be in a defined range.

In the described embodiments of the present invention, two paths are provided. One of these paths attenuates the larger signals whilst the other path amplifies the smaller signals. In one modification, more than two paths are provided. For example three paths could be provided. One path would attenuate the larger signals, the second path would amplify the smaller signals and the third path would leave unchanged those signals which initially have the correct amplitude.

Embodiments of the present invention have been described in the context of a receiver which is arranged to receive all N channels at the same time. Embodiments of the present invention are also applicable to receivers which receive only some (at least two) of the N channels at the same time. A plurality of receivers would be required but the number of receivers required would be less than N.

What is claimed is:

1. A device for ensuring that the amplitude of signals fall within a predetermined range, said device comprising:
   input means for receiving a plurality of input signals at substantially the same time;
   a first path for increasing the amplitude of any of the input signals having an amplitude below a first threshold;
   a second path for decreasing the amplitude of any of the input signals having an amplitude which exceeds a second threshold; and combining means for combining the outputs of the first and second paths to provide a plurality of signals having amplitudes between said first and second thresholds.

2. A device as claimed in claim 1, wherein the second path comprises attenuator means.

3. A device as claimed in claim 1, wherein signals which have an amplitude below said second threshold are removed by said second path.

4. A device as claimed in claim 3, wherein said signals which have an amplitude below said second threshold are reduced to substantially zero by said second path.

5. A device as claimed in claim 1, wherein the first path comprises amplifier means.

6. A device as claimed in claim 5, wherein an output of the second path is introduced into said first path and said output of the second path is used by said removing means to cancel out the signals in the first path having an amplitude exceeding the first threshold.

7. A device as claimed in claim 6, wherein a phase shifter is provided so that one of the signals output by the second path introduced into the first path and the signals of the first path is 180° out of phase with respect to the other of the signals output by the second path introduced into the first path and the signals of the first path.

8. A device as claimed in claim 6, wherein said removing means comprises a summer for summing the input to the first path with the output from the second path to cancel signals which have an amplitude which is the greater than the first threshold.

9. A device as claimed in claim 8, wherein gain control means are provided for ensuring that the amplitude of the signals which have an amplitude which exceeds the first threshold from the second path and the signals of the first path have the same amplitude.

10. A device as claimed in claim 1, wherein a summer is provided for summing an output of the second path with the output of the first path to provide an output of the device.

11. A device as claimed in claim 6, wherein the second path has a first output which introduces the signals of said second path into said first path and a second output which outputs the signals of said second path to a summer for summing with the signals of the first path.

12. A device as claimed in claim 7, wherein said second path has first and second path portions, said first path portion being between an attenuator means and said first output and second path portion being between said attenuator means and said second output.

13. A device as claimed in claim 1, wherein the input means are connected to splitter means which provide a plurality of sets of signals, each set comprising the plurality of input signals, each set of signals being applied both to said first and said second paths.

14. A device as claimed in claim 13, wherein the sets of signals have the same amplitude.

15. A device as claimed in claim 1, wherein output means are provided connected to the output of the first and second paths for outputting said signals to an analogue to digital converter.

16. A receiver incorporating a device as claimed in claim 1.

17. A base station incorporating a receiver as claimed in claim 16.

18. A method for ensuring that the amplitude of signals fall within a predetermined range, said method comprising the steps of:

receiving a plurality of input signals at substantially the same time;

increasing the amplitude of any of the received input signals in a first path having an amplitude below a first threshold;

decreasing the amplitude of any of the received input signals in a second path having an amplitude which exceeds a second threshold; and combining the outputs from the first path and the second path to provide a plurality of signals having amplitudes between said first and second thresholds.

19. A device for ensuring that the amplitude of signals fall within a predetermined range, said device comprising:

a receiver for receiving a plurality of input signals at substantially the same time;

a first path for increasing the amplitude of any of the input signals having an amplitude below a first threshold;

a second path for decreasing the amplitude of any of the input signals having an amplitude which exceeds a second threshold; and a combiner for combining the outputs of the first and second paths to provide a plurality of signals having amplitudes between said first and second thresholds.

* * * * *